United States Patent
Sibrai et al.

(10) Patent No.: US 6,784,757 B2
(45) Date of Patent: Aug. 31, 2004

(54) HIGH QUALITY PARALLEL RESONANCE OSCILLATOR

(75) Inventors: Andreas Sibrai, Krottendorf (AT); Kurt Fritzwenwallner, St. Johann-Koeppling (AT)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 25 days.

(21) Appl. No.: 10/337,019

(22) Filed: Jan. 6, 2003

(65) Prior Publication Data

US 2004/0113709 A1 Jun. 17, 2004

(30) Foreign Application Priority Data

Dec. 11, 2002 (EP) ............................................ 02392020

(51) Int. Cl.[7] ................................................. H03B 5/32
(52) U.S. Cl. ......................... 331/182; 331/176; 331/158
(58) Field of Search .............................. 331/182, 183, 331/176, 158, 116 R, 74; 368/200, 201, 202

(56) References Cited

U.S. PATENT DOCUMENTS

| 4,473,303 A | * | 9/1984 | Suzuki ....................... 368/201 |
| 5,150,081 A | * | 9/1992 | Goldberg ..................... 331/109 |
| 5,528,201 A |   | 6/1996 | Davis .................... 331/116 FE |
| 5,801,594 A | * | 9/1998 | Muto et al. .................. 331/158 |
| 6,052,036 A |   | 4/2000 | Enström et al. ............. 331/176 |
| 6,194,973 B1 |  | 2/2001 | Williamson ................. 331/109 |
| 6,278,338 B1 |  | 8/2001 | Jansson ................ 331/116 FE |

* cited by examiner

Primary Examiner—Robert Pascal
Assistant Examiner—Joseph Chang
(74) Attorney, Agent, or Firm—George O. Saile; Stephen B. Ackerman

(57) ABSTRACT

A highly stable single chip resonator controlled oscillator with automatic amplitude control and biasing is designed for manufacture with monolithic integrated circuit technologies. Analog and digital output buffers with elaborate control for power saving purposes and sophisticated start-up and power-up circuits ensure, that a crystal controlled oscillation is safely induced at start-up and that the amplitude of oscillation is continuously controlled during operation to reach low phase noise and reduce power consumption of the circuit.

42 Claims, 11 Drawing Sheets

Block Diagram

HIGH QUALITY PARALLEL RESONANCE OSCILLATOR

BACKGROUND OF THE INVENTION (1) Field of the Invention

The invention relates generally to electronic oscillators and in particular to improved crystal resonator, thin-film resonator or micro electromechanical resonator oscillators, realized with monolithic integrated-circuit technologies, where one chip solutions include automatic amplitude control and biasing to accommodate a highly accurate frequency-generation exhibiting low phase noise and stable amplitudes at higher frequencies.

(2) Description of the Prior Art

Most crystal oscillators in monolithic integrated circuit technology are developed using Pierce oscillator circuit schemes, where the frequency determining resonator is working in parallel resonance mode. Realized with quartz crystals as resonators normally only narrow band tuning is featured and phase noise is considered sufficiently good at frequency offsets not too far away from the oscillator carrier signal. It would be advantageous to extend the tuning range whilst maintaining a good phase noise behavior at far away offsets.

Crystal-controlled oscillators have been in use for decades in electronic systems as frequency references; but such oscillators have mostly been implemented using bi-polar transistors as active elements. However, the dominant technology for the fabrication of most integrated circuits today is CMOS and design techniques for highly stable crystal oscillators in this technology are less well known, especially when it comes to frequencies of about 100 MHz, as necessary for modem communication applications.

In the prior art, there are different technical approaches for achieving the goals of good tuneability and low phase noise. These crystal oscillator arrangements always include a piezo-electric, e.g. quartz, crystal and drive current means therefore. Unfortunately, these approaches are somewhat expensive, both in terms of technical complexity (e.g. differential push-pull or balanced bridge structures, extra filter or tank circuits, sophisticated temperature compensation or gain control circuits, amplitude peak detectors etc.) and— hence —commercial costs. It would be advantageous to reduce both expenses. This is achieved by using an oscillator circuit working with a crystal in parallel resonance mode, originating from Pierce. Using the intrinsic advantages of that solution—as described later on in every detail—the circuit of the invention is realized with standard CMOS technology at low cost.

Several prior art inventions describe related crystal oscillators.

U.S. Pat. No. (5,528,201 to Davis) describes a Pierce crystal oscillator having reliable start-up for a digital integrated circuit implementation, which has a capacitance element (such as a field effect capacitor) of an appropriate capacitance value disposed on-board the integrated circuit. One lead of the capacitance element is coupled to the input lead of the gain stage of the Pierce oscillator circuit whereas a second lead of the capacitance element is coupled to the output lead of the gain stage. Providing the capacitance element facilitates oscillator start-up and reliability by effectively eliminating the upper gain limit for oscillation. Specific circuit embodiments are also disclosed.

U.S. Pat. No. (6,052,036 to Enstrom et al.) discloses a highly stable single chip crystal controlled oscillator with automatic gain control and on-chip tuning. An amplitude detector monitors the output of a crystal controlled oscillator amplifier and produces a feedback signal proportional to the output signal of the amplifier to ensure oscillation is induced at start-up and that the amplitude of oscillation is limited to a preselected value during operation to conserve power consumption by the amplifier. The capacitor tank circuit connected to the input of the amplifier includes a voltage variable capacitor the voltage across which is initially established at manufacture to tune the oscillation frequency to a preselected value. The voltage across the voltage variable capacitor is also adjusted to compensate for temperature variations in the circuit.

U.S. Pat. No. 6,194,973 to Williamson) shows an oscillator with automatic gain control, where an oscillator having an adjustable gain circuit provides abundant gain when the oscillator is first powered up but reduces the gain substantially below its start-up value once oscillations build up, thereby substantially reducing the power consumed. The oscillator comprises an inverting amplifier coupled to a resonator, an oscillation detector coupled to the inverting amplifier, and a common-gate amplifier coupled to the oscillation detector. The inverting amplifier amplifies oscillations of the resonator according to a gain. The oscillation detector outputs a detection signal in response to oscillations of the resonator. The level of the detection signal is proportional to the amplitude of the oscillations. The common-gate amplifier receives the detection signal and, in response, limits the current to the inverting amplifier to control the gain based on the level of the detection signal.

U.S. Pat. No. (6,278,338 to Jansson) discloses a crystal oscillator with peak detector amplitude control. A crystal oscillator apparatus is described that has a wide dynamic frequency range and that is capable of supporting a broad range of crystal types. The present invention reduces the unwanted side effects that are associated with the prior art crystal oscillator designs, such as the clipping of signals, the introduction of signal distortion and unwanted signal harmonics. The present invention reduces the total wasted loop gain of the oscillator while also reducing the amount of integrated circuit real estate required to implement the crystal oscillator. The crystal oscillator apparatus of the present invention preferably comprises a crystal resonator circuit, an inverting amplifier, a bias circuit, a reference circuit, and a peak detector circuit. The present invention takes advantage of automatic gain control design techniques. The gain of the present crystal oscillator is automatically regulated using a closed loop circuit design. The present invention advantageously utilizes a peak detector circuit in combination with a reference circuit. The peak detector compares a reference signal with an amplified and inverted oscillation signal produced by a crystal resonator, and generates a feedback signal as a result of the comparison. The feedback signal controls a bias circuit that, in turn, controls the amplified inverted oscillation signal.

SUMMARY OF THE INVENTION

A principal object of the present invention is to provide an effective and very manufacturable method and circuit for generating resonator stabilized oscillation signals. The results are especially applicable and very efficient for use with resonators at least made up of Quartz or Piezo crystals, or of Thin-Film Resonators (TFR) or Micro Electro Mechanical System (MEMS) resonators but not restricted to only those types of resonators.

Another further object of the present invention is to attain low amplitude distortion of the oscillator signal.

Another still further object of the present invention is to reach a low phase noise behaviour of the circuit, i.e. to attain a high frequency stability.

Also an object of this invention is the starting up of the generation process of the oscillation signal at maximum speed.

Another object of this invention is minimizing the distortion and the phase noise of the generated oscillation signal in steady state operation.

A still further object of the present invention is to reduce the power consumption of the oscillator circuit by realizing inherent appropriate design features.

Another further object of the present invention is to reduce the cost of manufacturing by implementing the circuit as a monolithic integrated circuit in low cost CMOS technology.

Another still further object of the present invention is to reduce cost by minimizing the chip area by means of effectively minimizing component values.

In accordance with the objects of this invention, a circuit, capable of generating a crystal controlled oscillator output signal is achieved. Said circuit comprises means for generating an oscillating signal having a stable and predetermined oscillation frequency with means for driving said oscillation generating means and for matching the impedance levels between said oscillation generating means and this oscillator driving means. Also comprised are means for automatic amplitude controlling and biasing the generated oscillation signal of said oscillation generating means and said oscillator driving means, thus controlling the amplification factor (gain) of said oscillator driving means in such a way, that a steady oscillation signal is maintained. Thereby biasing the circuits of said oscillation generating means and said oscillator driving means in such a way, that an optimized operating mode is obtained. The circuit further comprises means for a first buffering of said generated oscillation signal of said oscillation generating means and said oscillator driving means as a sine wave signal, named also as analog signal. Equally comprised are means for a second buffering of said generated oscillation signal of said oscillation generating means and said oscillator driving means as a digitally transformed, rectangular square wave signal. Still further comprised are means for generating the start-up control signals for said oscillation generating means and said driving oscillator means to ensure a safe start-up procedure. Finally comprised are means for generating the power-up and shut-down control signals for said oscillator driving means, for said automatic amplitude controlling and biasing means, for said first buffering means and said second buffering means, and for said start-up means.

Also in accordance with the objects of this invention, a method for generating a stable, amplitude controlled oscillation signal within an electronic device or technology is given. Said method includes providing a resonator element for determination of the oscillator frequency and providing a Pierce oscillator circuit for driving this resonator element. The method further comprises providing an automatic amplitude control circuit for stabilizing the oscillation signal together with providing a biasing circuit for the amplification of the oscillation signal. Also included in the method is providing an analog output buffer circuit for isolating the oscillator circuit from load influences and providing a digital output buffer circuit for transforming the sine wave oscillator circuit into a square wave signal. Finally comprised is providing a start-up circuit for establishing secure start-up conditions for the Pierce oscillator and the automatic amplitude controller and biasing circuit just like providing a power-up circuit for fast power-up action and for enabling an operation in power saving mode.

BRIEF DESCRIPTION OF THE DRAWINGS

In the accompanying drawings forming a material part of this description, the details of the invention are shown.

DESCRIPTION OF THE PREFERRED EMBODIMENTS

The preferred embodiments disclose a novel circuit for a crystal oscillator and a method of controlling amplitude and frequency of said oscillator.

The description of the preferred embodiments of the invention is subdivided in two steps; firstly an overall description of the whole circuit and a short explanation of every functional circuit block is given and secondly a much more detailed description of each said functional circuit block together with its precise circuit schematics is following.

Figure 1:
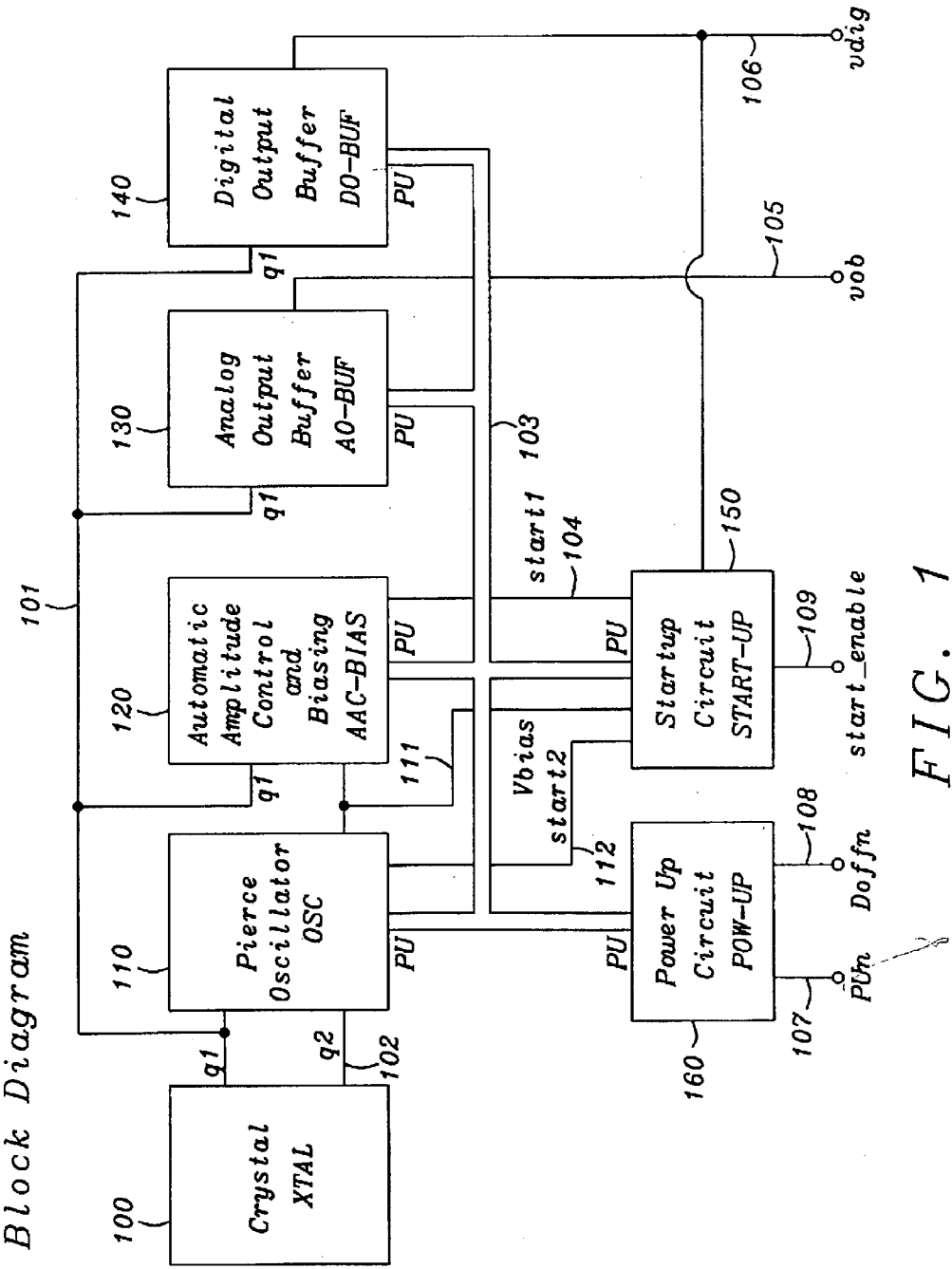
FIG. 1 illustrates the building blocks for the preferred embodiment of the present invention. The block diagram shows all six essential circuit blocks realizable with modern monolithic integrated-circuit technologies.

Referring now to FIG. 1, the preferred embodiment of the circuit of the present invention is illustrated. The essential functional components of the oscillator according to the invention are shown in FIG. 1 in the form of a block diagram. The oscillator consists of the resonating—in this special case—crystal (XTAL) 100, directly connected—with its both terminals, 101 and 102—to the Pierce Oscillator (OSC) block 110. The crystal terminals are designated as first XTAL pin q1 (101) and as second XTAL pin q2 (102); pin q2 being solely connected to said oscillator block OSC, whereas pin q1 besides being connected to said oscillator block OSC is also connected to the Automatic Amplitude Control and Biasing (AAC-BIAS) circuit block 120, to the Analog Output Buffer (AO-BUF) circuit block 130, and to the Digital Output Buffer (DO-BUF) circuit block 140, all via lead 101. The resonator signal at pin q1 or lead 101 is thus the essential, controlled and supervised signal of the whole oscillator according to the invention. Further internal necessary signals of the whole oscillator circuit are active on bus 103 in the block diagram and are named in all as signals "PU", standing for Power-Up; which are used to initialize the power-up process of the oscillator circuit and are also used for shutdown.

As can be seen from the block diagram in FIG. 1, besides being connected to the aforementioned four circuit blocks OSC, MC-BIAS, AO-BUF and DO-BUF, said bus 103—with signals "PU"—is continued to the Start-Up (START-UP) circuit block 150 and the Power-Up (POW-UP) circuit block 160. A signal called "start1" on lead 104 from the START-UP circuit block 150 to the AAC-BIAS block 120 is additionally shown. One input signal, named "start_enable" is fed into the START-UP circuit block 150 and the POW-UP circuit block 160 has two input signals: "PUn" 107 and "Doffn" 108. Another signal "Vbias1" connects via lead 111 the Pierce oscillator circuit block 110 with the AAC-BIAS block 120 and the START-UP circuit block 150. The precise function of all these signals will be described later in connection with a more detailed description in the extra chapters about every single circuit block. The output signal 105 of the analog output buffer block AO-BUF 130 is named "vob"; this signal constitutes the analog output signal of the oscillator of the invention, with sinusoidal shape of its according time function. The output signal 106 of the digital output buffer block DO-BUF 134 is designated as "vdig" and constitutes the digital output signal of the oscillator of the invention, with rectangular shape of its according time function. The abbreviations for the circuit block names given in brackets are for mnemonic purposes and for future reference.

Here now following is a short description of every circuit block in FIG. 1, more detailed explanations are given later:

1. Item 100 in FIG. 1: Quartz Crystal Resonator (XTAL)

This block represents here—chosen as a special case—a quartz crystal (XTAL) resonator, which can be in general any resonator type (TFR, MEMS etc.) and which may normally be connected externally to the integrated circuit, as a so called Off-Chip part. Nevertheless for low cost solutions an On-Chip integration of the resonator device is also feasible, yet with a somewhat reduced stability performance of the circuit.

Especially resonators of type TFR should be integrated on the chip as MEMS or in a similar third dimension build-up technology.

The circuit is designed to nominally operate with any type of crystal with resonance frequencies between 1 MHz and 30 MHz, utilizing parallel resonance mode. The generated frequency depends entirely on the XTAL and the current structure can even operate at XTAL resonance frequencies up to 100 MHz. The equivalent circuit model of the XTAL and the values of its components are provided by the XTAL manufacturer. For the equivalent circuit model used and its description refer to FIG. 2 below. FIG. 3 depicts the impedance vs. frequency diagram of the XTAL, where the regions for the possible cases of operation in serial or parallel resonance mode are tagged.

2. Item 110 in FIG. 1: Pierce Oscillator (OSC):

This circuit block is designated as core of the oscillator, the circuit of which was originally suggested by Pierce [Pierce. G. W.; Proc. Amer. Acad. Arts Sci.; Vol.63 (1928) p. 1–47] and which is modified here.

Any oscillator, RC, LC or crystal—controlled, requires two conditions to be met for operating at the desired oscillator frequency; its loop gain must be greater than unity at the oscillator frequency and its close-loop phase shift must be zero (or 2n radians where n=0 or a whole integer).

Within this oscillator core these amplitude and phase conditions for steady oscillations are established and maintained. This core in a whole constitutes an amplifier with positive feedback. The necessary amplitude condition for oscillations is therefore fulfilled by adjusting the gain of the amplifier. The components of the amplifier make up—together with the XTAL—the resonant effective part of the chip, also called resonance group, i.e. resonator 100 & amplifier 110 together form the resonance group. The feedback of the amplifier and all frequency dependent components within the core determine the correct phase conditions for oscillations. For the detailed electrical circuit schematics refer to FIG. 4.

3. Item 120 in FIG. 1: Automatic Amplitude Control and Biasing (AAC-BIAS)

The circuit block for automatic amplitude control and biasing includes the following functions:

maintaining automatically a constant voltage amplitude of the oscillator signal, preventing an amplitude modulation of the oscillator signal, which can be considered a side effect with respect to frequency instability, i.e. frequency modulation, thus influencing phase noise, keeping the quiescent currents of the main amplifying transistors (determined by the current gain or transconductance $g_m$ of the MOSFETs) constant.

Where the transconductance $g_m$ is defined as $g_m = \Delta I_D / \Delta V_{GS}$ with [S] as units. $I_D$ being the DC drain current and $V_{GS}$ being the DC gate-source voltage of the field effect transistor (FET). This can be expressed also in AC quantities as $g_m = I_d / V_{gs}$; where rearranging the terms leads to $I_d = g_m * V_{gs}$ ([S]=siemens=1/ohm=1/[Ω]).

These above enumerated principal goals for the design of the AAC-BIAS block shall assure the proper and fast start-up process of the oscillator, must avoid any unwanted amplitude modulation in the steady state, and will also stabilize the generated amplitude of the signal. The successful achievement of these design goals is reached through a close tracking of the generated oscillator core signal and by adjusting the quiescent currents of the amplifier, i.e. controlling the transconductance $g_m$ and the gain of the transistors. Consequently the amplitude control and the self biasing circuitry are combined within one circuit block. A more thorough explanation of these important functions of the electrical circuit is given in connection with FIG. 5.

4. Item 130 in FIG. 1: Analog Output Buffer (AO-BUF)

Figure 6:
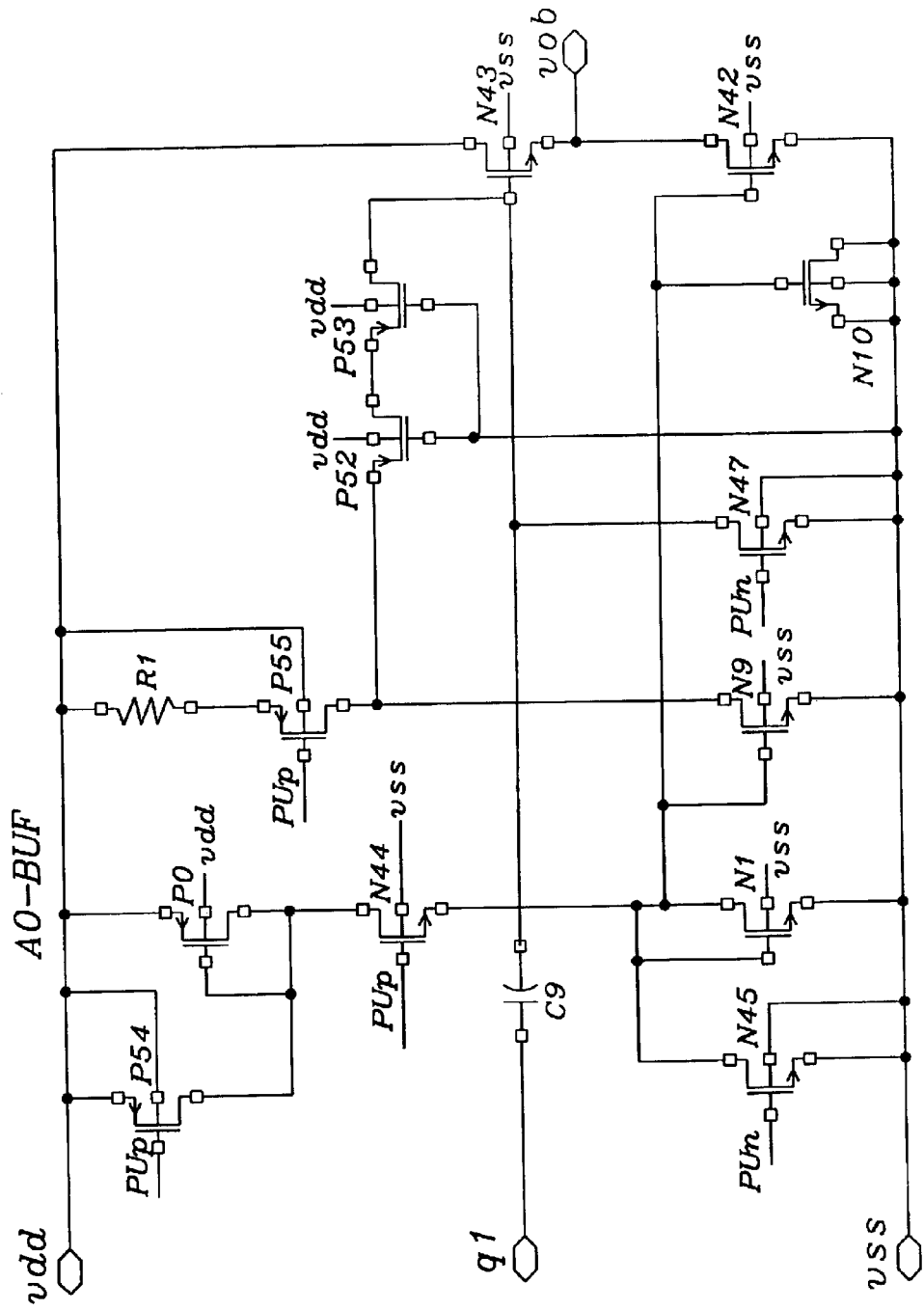
FIG. 6 shows the electrical circuit schematics of the third circuit block, called the analog output buffer circuit block.

The analog output buffer AOBUF is introduced in order to supply the load with the needed output power for the generated sinusoidal oscillator signal. Another main purpose of this circuit block is to isolate the core of the oscillator from the load. Isolation signifies in this context, that a varying output load shall have no influence on the generated oscillator signal. That is why the buffer has to have a low output impedance and at the same time the capability to deliver enough power for driving the needed loads. Also essential for this buffer is a good linearity and low noise, in order not to add additional phase-noise to the system. Additionally, this stage is capable of supplying necessary DC offsets to the signal. The electrical circuit schematics are depicted in FIG. 6.

5. Item 140 in FIG. 1: Digital Output Buffer (DO-BUF)

Figure 7:
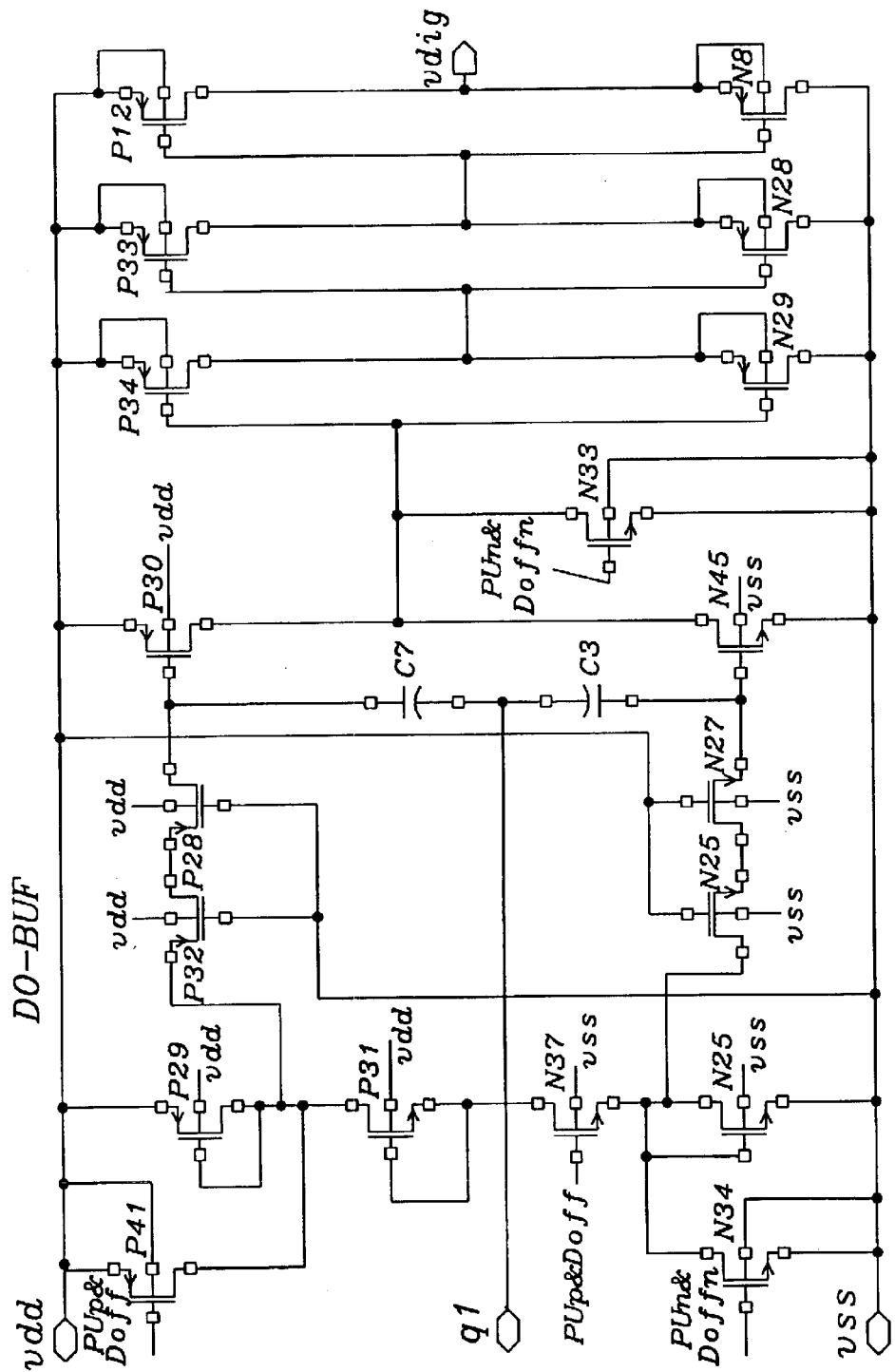
FIG. 7 presents the electrical circuit schematics for the fourth circuit block, named as digital output buffer circuit block.

The digital output buffer circuit block generates a rectangular signal or square wave. The digital output buffer is designed for supplying the load with the necessary power of the rectangular signal for driving ordinary digital circuitry and an extra DC offset, if needed. It is assumed, for example, that the load consists of a capacitor of 15 pF in parallel with a resistor of 200 kΩ. The circuit of the invention has to provide the protection of the core generated, stable oscillator frequency from the disturbances coming from the load, i.e. reduce the value of the pulling figure as far as possible. The electrical circuit diagram is shown in FIG. 7.

6. Item 150 in FIG. 1: Start-Up Circuit (START-UP)

All crystal based oscillators exhibit a slow start-up action, when no extra precautions are taken. In order to speed up this procedure, a start-up circuit is included. This circuit is user controllable via signal "start_enable" at pin 109.

7. Item 160 in FIG. 1: Power-Up Circuit (POW-UP)

This power-up circuit provides a power saving mode while maintaining the basic oscillator operation after power up. It is equally used for save power-up and shut-down of the complete oscillator according to the invention.

In the following, each already in FIG. 1 shown and introduced circuit block is extensively explained, with the aid of its complete circuit schematics and additional diagrams for characteristic and relevant physical quantities. The novelties and advantages of the invention are listed for every circuit block.

Figure 2:
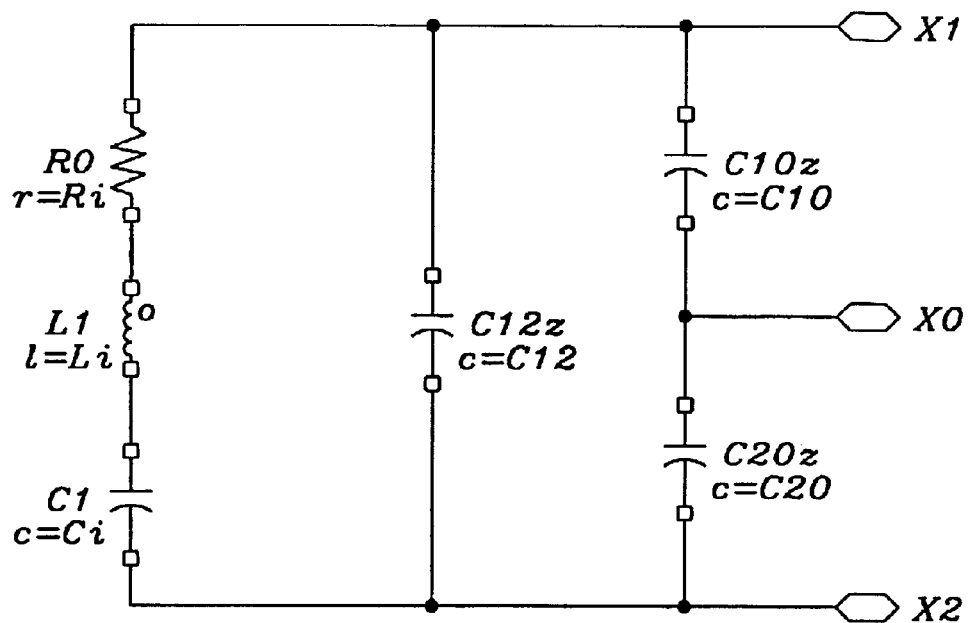
FIG. 2 shows the electrical equivalent circuit diagram for the crystal resonator.
Figure 3:
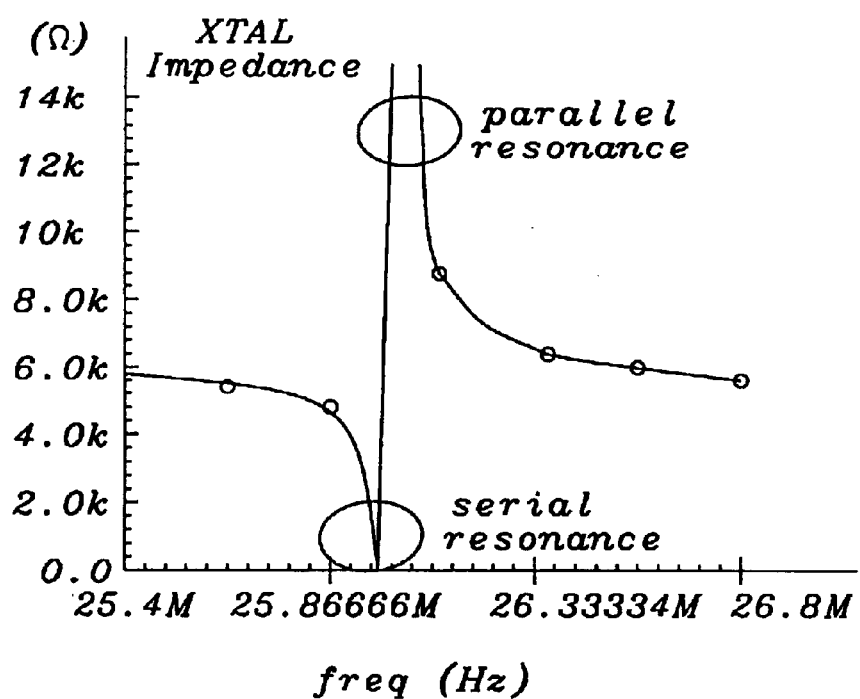
FIG. 3 depicts the impedance vs. frequency diagram of the crystal resonator. The two resonances presently illustrated—serial and parallel, which occur at about 26 MHz—are taken as an example. The invention however covers all similar resonance curves, which may extend from very low frequencies —for example with ceramic resonators in the range of only a few kHz—to very high frequencies—for example several GHz in the case of thin film resonators (TFR). The invention covers the whole frequency range.

FIG. 2 shows the equivalent circuit diagram of a typical electrical model for a quartz crystal as used for the calculations within the simulation of the oscillator circuit.

The crystal is essentially modeled as a three-pole network, consisting only of a few passive components, where:

$L_1$, $C_1$, and $R_0$ determine the serial resonance frequency of the quartz, $L_1$, $C_1$, $R_0$ and $C_{12}$ determine the parallel resonance frequency, and $C_{10}$ and $C_{20}$ represent the parasitic capacitances to ground for the crystal's plates and the package parasitics.

The poles or pins of the crystal are designated: $X_1$, $X_2$—as active XTAL pins and $X_0$—as the ground XTAL pin. To gain more insight into and develop a feeling for the physics the components together with their typical numerical values—as received from the crystal manufacturer—are shown here:

| | | |
|---|---|---|
| —$L_1$ = | 5.643 | [mH] |
| —$C_1$ = | 6.645 | [fF] |
| —$R_0$ = | 11.15 | [ω] |
| —$C_{12}$ = | 1.3 | [pF] |
| —$C_{10}$, $C_{20}$ = | 1 | [pF] |

(The influence of the two latter capacitances $C_{10}$ and $C_{20}$ is very often negligible, as they are connected in parallel to the terminal pairs $X_1$–$X_0$ and $X_2$–$X_0$).

As can be seen from FIG. 2 there are two possible resonances of the circuit (while neglecting the influence of $R_0$). One—the serial resonance—formed only with $L_1$ and $C_1$, the other—parallel resonance—formed with $L_1$ and $C_1$ together with $C_{12}$. Calculating the parallel resonance frequency $f_{res(parallel)}$ according to the following formula $f_{res(Parallel)} = (\frac{1}{2}\pi)*(L_1*C_1 \& C_{12})^{-1/2}$, where $C_1 \& C_{12} = C_1*C_{12}/(C_1+C_{12})$, which leads to $f_{res(Parallel)} = 26.057$ MHz. Usually the manufacturer is already specifying the parallel resonance frequency of the quartz.

The quality factor of the crystal is determined mainly from $L_1$ and $R_0$. The determining formulas are $Q=1/R_0*(L_1/C_1)^{-1/2}$ thus a higher serial inductance and a lower serial resistance will lead to a higher quality factor. Calculating with the values from above leads to Q=82 648, which is really high. A high quality factor improves the phase noise performance of the circuit at close-in offsets and decreases the carrier instability.

In FIG. 3 the frequency diagram of the equivalent impedance of the crystal XTAL, as used in our application, is shown. At the resonance frequency, when observing the case of parallel resonance, i.e. the higher one, the impedance is nearly infinitely high. The basic idea behind the oscillators with parallel type resonance is now to utilize exactly this frequency region. The general principle of operation is further described in the chapter dealing with the core of the oscillator.

Figure 4:
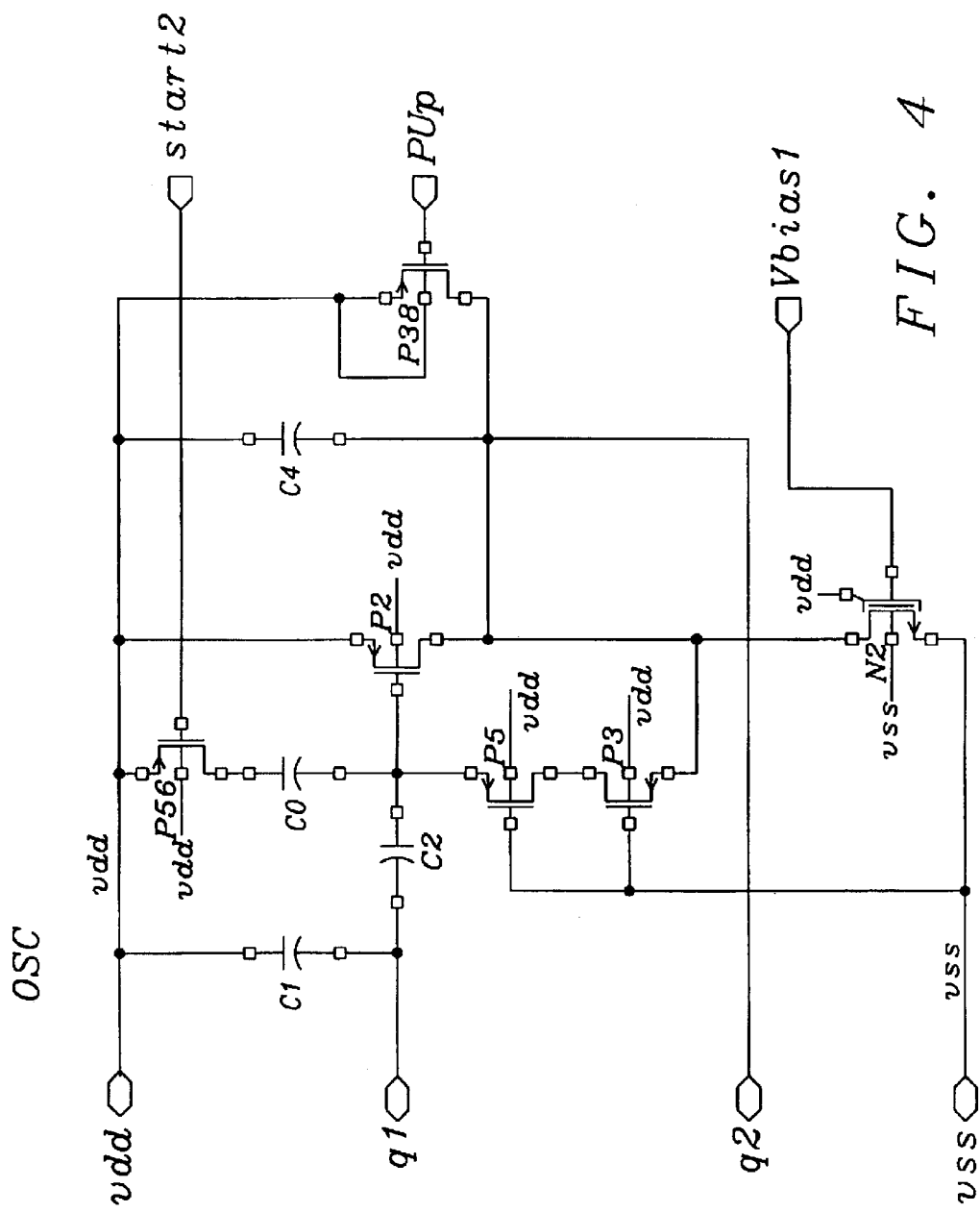
FIG. 4 presents the electrical circuit schematics for the first circuit block, forming—together with the crystal—the Pierce oscillator core.

FIG. 4 reveals the electrical circuit schematics of the modified Pierce oscillator core.

The crystal is connected to the oscillator circuit between pins q1 and q2. After the "PUn" signal—input to POW-UP—is driven from Vdd to Vss (GND), the NMOS transistor N2 is provided with the start-up biasing value of "Vbias1". This biasing value depends on the connection of the "start_enable" pin to either Vdd or Vss. Connection to Vss disables the start-up function and the "Vbias1" value is only contingent on the resistance value of resistor R0 and the native noise at the gate of PMOS Transistor P8. Both components (resistor R0 and transistor P8) are included in the automatic amplitude control and biasing block, AA-BIAS. If the "start_enable" pin is connected to Vss, the gate of PMOS transistor P8 is forced to GND and the maximum available current is flowing through the NMOS transistor N3, part of AA-BIAS, which in turn supplies via lead "Vbias1" the maximum allowable current to transistor N2. Due to this current the transistor P2 has a high transconductance $g_m$, which is far away from the critical value $g_m$, beyond which no oscillation is possible. Transistors P3 and P5 are acting as high ohmic resistors to bias the gate of transistor P2 with the proper DC voltage. The bias point voltage must be set very carefully to prevent distortions of the sine wave applied to the crystal on pin q2. Distorted signals have a very deleterious influence on the phase noise of the oscillator. The signal fed to the gate of transistor P2 is not allowed to exceed a certain level, because otherwise transistor P2 will not be working in the linear region which then leads to higher phase noise. On the other hand, the influence of external spikes should be minimized, thus this voltage at pin q1 should be sufficiently high. In order to fulfill both requirements together, a capacitive divider—C0 and C2—is used to keep the signal small at the gate of transistor P2, whereas the automatic gain control circuit has the full level of the signal at pin q1 at its disposal. To complete the Pierce oscillator scheme, the two necessary capacitors C1 and C4 are added. Capacitor C1 leading from q1 to Vdd and capacitor C4 leading from q2 to Vdd. One further control signal is handled in the OSC circuit block, namely "PUp" which is supplied from the POW-UP block, via "PU" to the gate of transistor P38.

Further provisions and novelties in the oscillator core circuit (FIG. 4) of the invention:

Enhancement of the circuit performance with respect to phase noise per effective reduction of transistor noise. This is accomplished by usage of special device structures to reduce the 1/f noise. To reduce the noise floor and influences from the substrate, isolated NMOS transistors (triple well) were used.

In manufacturing the integrated circuit a chip technology is chosen, which uses a triple well process and thus substantially reduces the substrate cross talk. Using metal-metal capacitors (with resultant high quality factors of the capacitors) further enhances the circuit performance with respect to phase noise.

Figure 5:
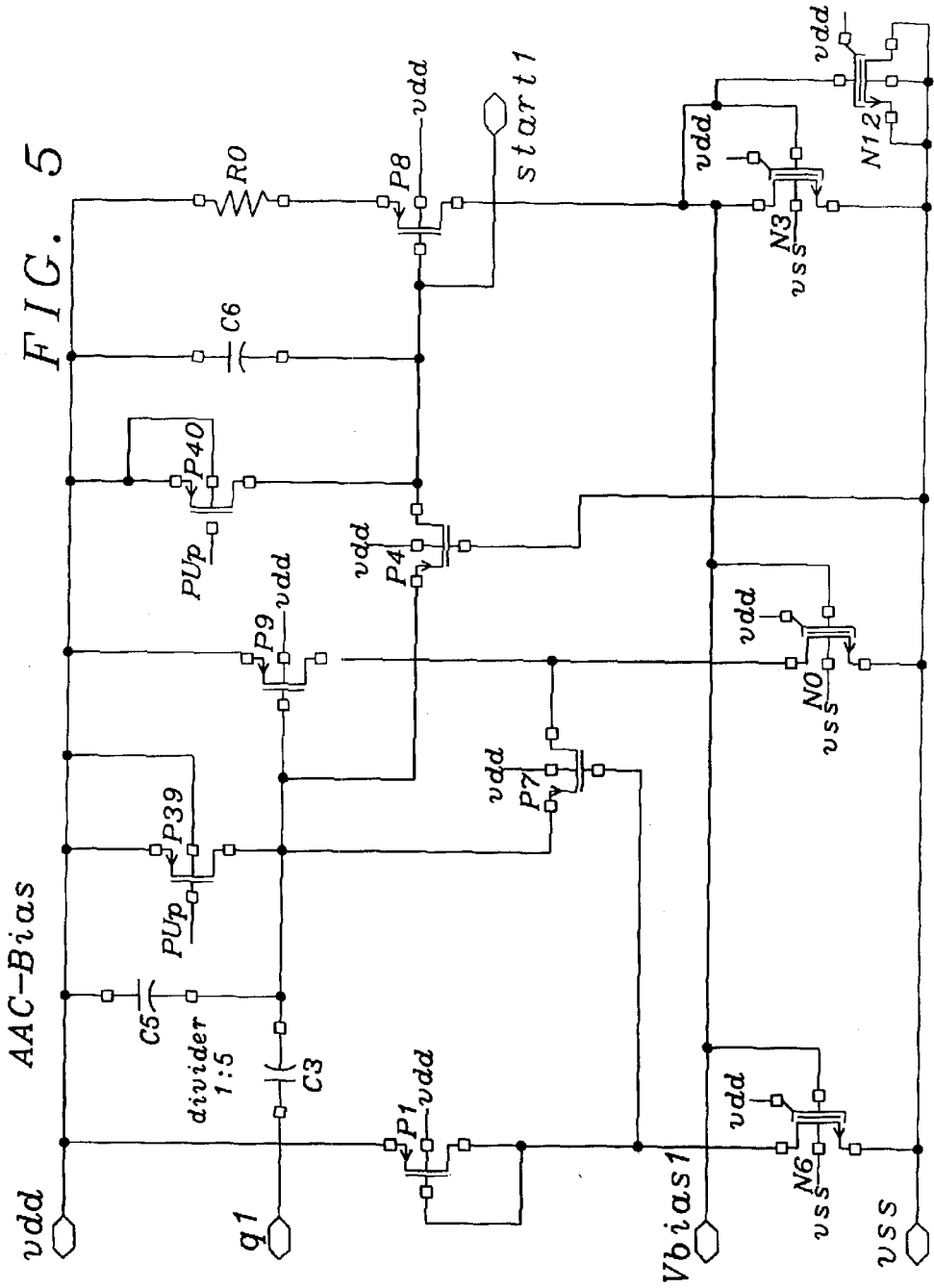
FIG. 5 presents the electrical circuit schematics for the second circuit block, called the automatic amplitude control and biasing circuit block.

Refering now to FIG. 5, the electrical circuit schematics of the automatic amplitude control and biasing circuit block AA-BIAS for the amplitude control of the oscillator core signal are explained. The automatic amplitude control function and the biasing task are combined together in one circuit block due to the influence of the bias current on the swing amplitude of the oscillator signal.

Description of the biasing part (BIAS):
This part consists of three components, resistor R0, PMOS transistor P8 and the NMOS transistor diode N3 which is a part of the current mirror which supplies the Pierce oscillator with the bias current The function of transistor P8 is to control the current flow depending on the outcome of the amplitude regulation circuit. The resistance value of resistor R0 determines the maximum available current at a given supply voltage. Depending on the gate voltage of transistor P8 the current flowing through the N3 diode mirrors the current by the given transistor ratios into transistors N0 and N6 of the amplitude regulation circuit. This current is mirrored additionally to the Pierce oscillator amplifier (transistor N2 in OSC) and to the start-up circuit (transistor N35 in START-UP); via lead "Vbias1" . The NMOS transistor N12 acts as stabilizing capacitor for the current mirror.

Description of the automatic amplitude control part (MC):
The amplitude regulation is based on a generally known circuit. At start-up, when no oscillation occures, the circuit behaves as a current source, which delivers the start-up current to the Pierce oscillator biasing transistor N2 in circuit block OSC, again via lead "Vbias1". The value of the start-up current is defined by the relations at transistor N2 (of circuit block OSC), transistor N3, and resistor R0, the ratio of transistors P8 and P9 and the thermal voltage U(T). Signal "start1" serves as start-up control signal for the circuit. With a growing oscillator amplitude at node q1 the current through transistor P8 decreases until it reaches a predefined value; transistors P8 and P9 are operating in weak inversion region. As already described, this value is only determined by the current gains of the loop transistors P8, P9 and N3 and again the thermal voltage U(T). Where the ratio (N3/N2) of transistor dimensions of N2 and N3, which are building a current mirror, defines the amount of the mirrored current i.e. current gain. To avoid amplitude modulation at node q1, the transistors P8 and P9 must work in the weak inversion region. This is guaranteed by a calculated fixed scaling factor between P8 and P9. This scaling factor is then additionally influenced by the ratio of N3 to N2. The oscillation amplitude is adjusted by the capacitive divider C3 and C5 at the input q1 referring to Vdd. The DC voltage biasing is done by the transistors P1, N6, P7, N0, where transistor P7 is acting as a resistor. For the loop stabilization a low pass filter, consisting of P4 as resistor and capacitor C6 is used. For loop stability reasons the omega*tau value should be much larger than one, where omega equals 2*PI*frequency and tau is the time constant defined as (resistance of P4)*(capacitance of 6). Thereby the amplitude at node q1 remains stable, which signifies for the oscillator signal, that there is no amplitude modulation, thus preventing its possible deleterious influence on the phase noise behavior. The transistors P39 and P40 manage the power-up function, via signal "PUp".

Further provisions and novelties in the automatic amplitude control and biasing circuit (FIG. 5):
Application of full isolation NMOS transistors for reducing close to carrier phase noise, where the chosen chip technology provides a 'triple well' process for isolating the NMOS transistors from the substrate, substantially reducing cross talk.

Use of optimized active devices for reduced flicker noise and wide band noise, by reducing the amount of active devices—which means reducing the number of noise sources—by designing for an appropriate functionality of the circuitry. Additionally optimized transistor shapes reduce the 1/f noise to a minimum. The gate of transistor P4 is referenced to GND to reduce the effects of amplitude modulation for the oscillator core signal as compared to a direct connection to the drain of transistor N6.

FIG. 6 depicts the electrical circuit schematics of the analog output buffer AO-BUF:
This output buffer circuit is realized as a self biased source follower. The drive capability of this buffer circuit can be described with the help of a permitted load of a 1 kΩ resistor in series with a capacitor of 2.2 nF; (where 6 dB damping in the frequency range of 2 MHz to 40 MHz—without distortions—is allowed). The transistors P0 and N1 provide the bias current for the output stage with transistors N42 and N43. The DC biasing voltage of transistor N43 is produced by resistor R1 and transistor N9 and then applied to the gate of transistor N43 via the transistors P52 and P53, which are working as resistors. The transistors P54, N44, N45, P55 and N47 are providing the power-up function. They are controlled with the help of the complementary signals "PUp" and "PUn", introduced to AO-BUF via "PU". Transistor N10 acts as a stabilization capacitor. Capacitor C9 realizes the loose coupling to the oscillation signal at node q1. The analog oscillator output signal is delivered as sine wave to pin "vob".

Novelty in the analog output buffer circuit (FIG. 6):
Transistors P52 and P53 are used as biasing resistor for N43, with the goal to enlarge the input impedance of the stage. Thus a loose coupling with a very small capacitor (C9=200 fF) can be used to reduce oscillator pulling effects thus considerably enhancing the phase noise behavior of the oscillator FIG. 7 shows the electrical circuit schematics of the digital output buffer circuit block DO-BUF:
This digital buffer circuit consists of two distinct parts: a self biased class AB stage and a three stage inverting digital amplifier chain. The transistors P30 and N24 are building the class AB stage biased from the transistor chain P29, P31 and N25. The biasing for transistor P30 is applied via the transistors P28 and P32. Both are working as resistors. Similarly the transistor N24 is powered via transistors N26 and N27. The oscillation voltage is fed into the circuit via pin q1 across the capacitors C7 and C8. The gain of the class AB amplifier amounts to approximately 27dB in the frequency range from 1 MHz to 40 MHz. The output of the class AB stage is connected to the input of the first digital inverter which is built up by the transistors P34 and N29, followed by two inverter stages where the transistors at every stage are three times larger than at the stage before, in order to attain low output impedance. The digital oscillator output signal can be found at pin "vdig", in form of a rectangular square wave. With an output load, consisting of a resistor of 200 kΩ in parallel with a capacitor of 15 pF the resulting rise time of the square wave output signal of 30 MHz accounts for 4.78 ns and the fall time for 6.6 ns. The transistors P41, N37, N34 and N33 are managing the power-up transaction—controlled by two signals "PUp&Doff" and "PUn&Doffn" applied from POW-UP via "PU"—and (as a special function) a digital-buffer-off state while maintaining the oscillator circuit active.

Novelty in the digital output buffer circuit (FIG. 7):
The driver capability of transistors P38 and N24 is twenty times larger as for transistors P34 and N29 in order to reduce the kick-back noise of the following digital switching circuitry. This results in a better phase noise behavior.

Figure 8:
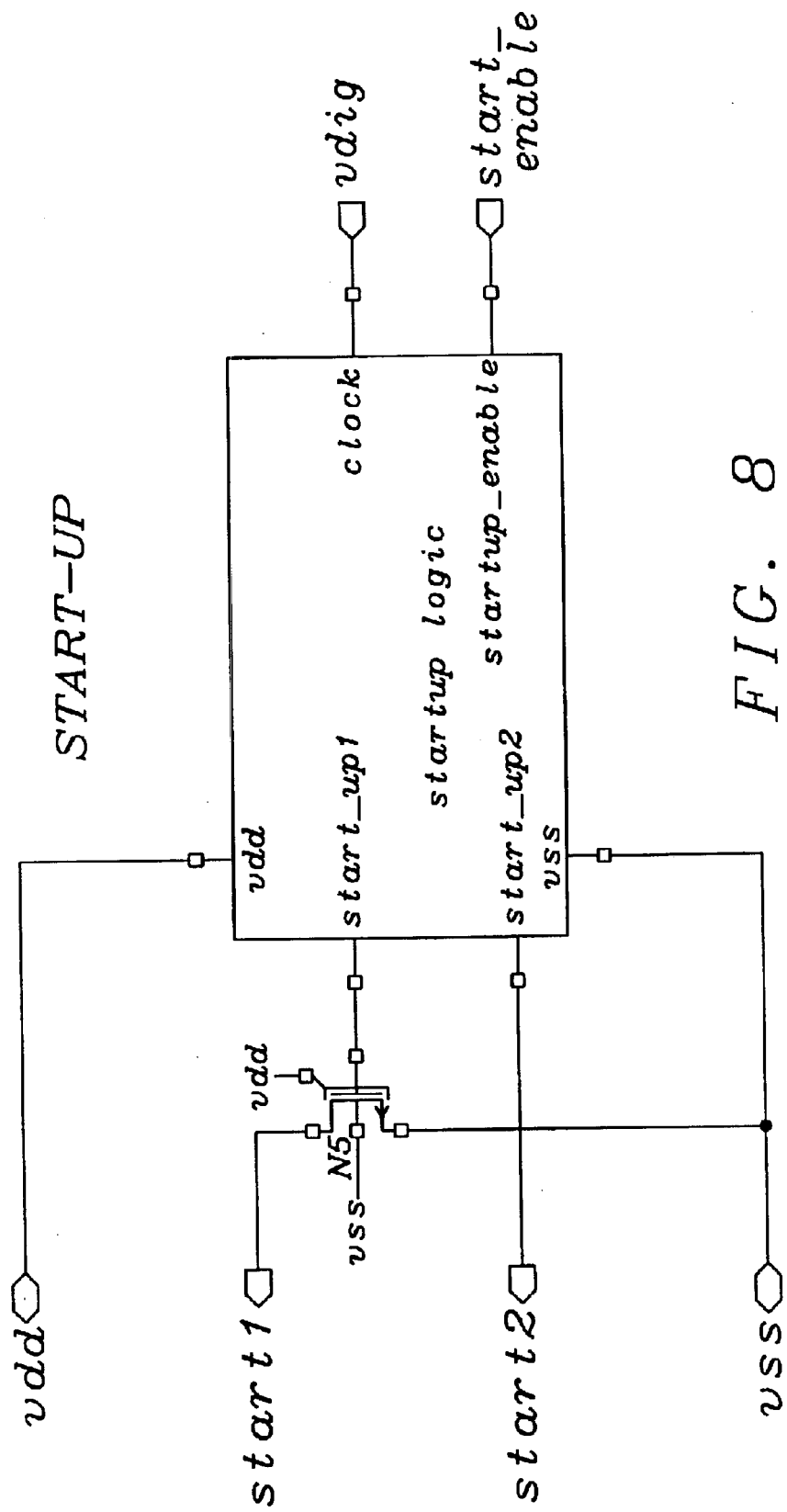
FIG. 8 presents the electrical circuit schematics for the fifth circuit block, described as start-up circuit block.

FIG. 8 shows the electrical circuit schematics of the start-up circuit START-UP.
If, at an initial condition after power-up no current flows through transistor P8 of MC-BIAS, this circuit ensures, that a save current can be provided and a fast startup of the oscillator is ensured. After the save current is flowing through transistor N3 of AAC-BIAS the start-up circuit provides the startup current. This is ensured by the "start_up1" signal (startup_logic block) connected to N5 and the "start_up2" signal (startup_logic block) connected to the transistor P8 in the OSC block. If the "start_enable" signal pin is connected to GND or left open the start-up circuit is disabled. If "start_enable" is tied to the positive supply voltage Vdd and the power-up procedure is enabled by connecting signal "PUn" of POW-UP to GND the start-up circuit is enabled and therefore active. Vdd is applied to transistor gate N5 which enforces a GND level at the gate of transistor P8 in the AAC-Bias circuitry. Consequently P8 is switched to the low ohmic state and the startup current, limited by R0 (AAC-Bias), is mirrored with the help of N3 (AAC-Bias) to the oscillator (OSC). With the "start_up2" signal provided from the startup_logic, the capacitive divider is switched off by means of P56 in the OSC circuitry. Due to this measure the feedback voltage level at gate of P2 (OSC) is higher, which meets in a much faster oscillator startup time. After the oscillation amplitude reaches a certain value, a digital clock signal "vdig" is generated by the DO-BUF block, which is applied to pin clock of the startup_logic block. The startup_logic now generates well defined delay time signals ("start_up1", "start_up2"). When the first delay time is reached signal "star_up1" switches to GND, transistor N5 goes to the high ohmic state therefore the startup current decreases to the opertion current. The second delay time, which occurs after the first delay time forces the "star_up2" signal to GND. This action switches the capacitive divider (OSC block) on again. The whole oscillator circuitry is now in the operating mode.

Novelty in the start-up circuit (FIG. 8):
Due to process variations in manufacturing of the integrated circuits it is not guaranteed that a start-up of the oscillator is always reached. Secure start-up relations for the oscillator circuit are established and automatically switched off again after successful initiation of the oscillation. Standard sold integrated oscillator circuits are reaching 5 ms of startup time. With the described circuitry above startup times of about 1 ms are achievable. This action of the start-up circuit block of the invention ensures save operation under all circumstances.

Figure 9:
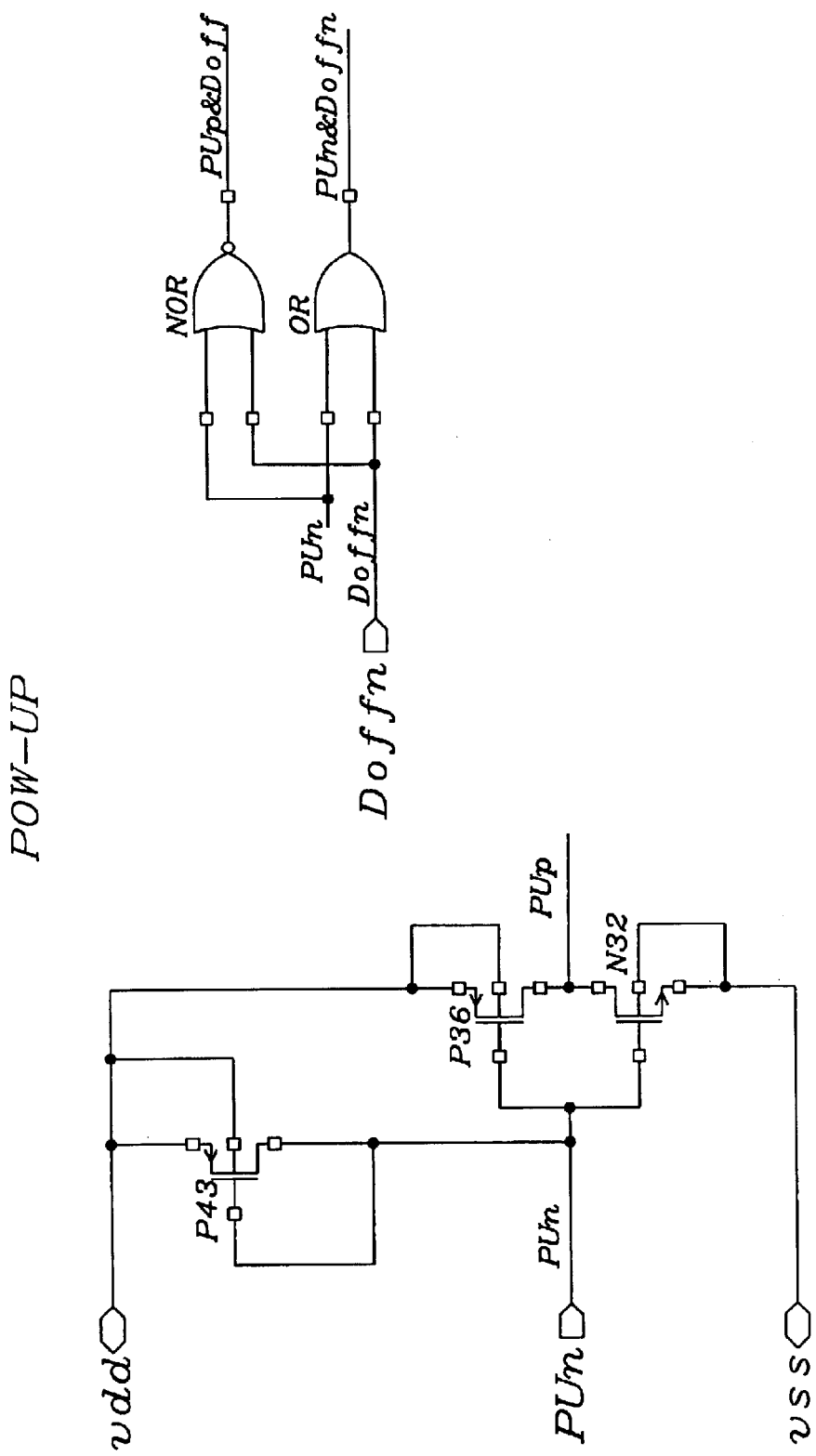
FIG. 9 shows the electrical circuit schematics of the sixth circuit block, comprising the power up circuit block.

FIG. 9 shows the electrical circuit schematics of the power-up circuit POW-UP.
The power-up circuit block ensures save power-on and power-off transactions of the oscillator circuit. Especially for battery supplied applications, the reduction of power consumption to a minimum during power save state is very important. With the "Doffn" signal, the digital buffer can be switched off separately. The digital buffer consumes about 35% of the overall power. Additionally, within the power-up circuit block some appropriate logical combinations of signals are performed, in order to simplify the control logic for the individual circuit blocks.

Thus, as can easily be seen from FIG. 9, out of the two input signals "PUn" and "Doffn" three derivatives "PUp", "PUp&Doff", and "PUn&Doffn" are generated. "PUn", "PUp", "PUp&Doff", and "PUn&Doffn" together are combined into the "PU" signal bus.

The preferred embodiment of the present invention preferably comprises transistors, built with MOSFET technology, alike resistors and capacitors implemented on a single integrated circuit device. By implementing the present inventive crystal oscillator as a monolithic integrated circuit device, the deleterious effects introduced by temperature variations are advantageously reduced or even nullified.

Additionally supplied are the following pictures (FIGS. 10 and 11), results of measurements and simulations, thus giving evidence of the performance of the new parallel oscillator.

Figure 10:
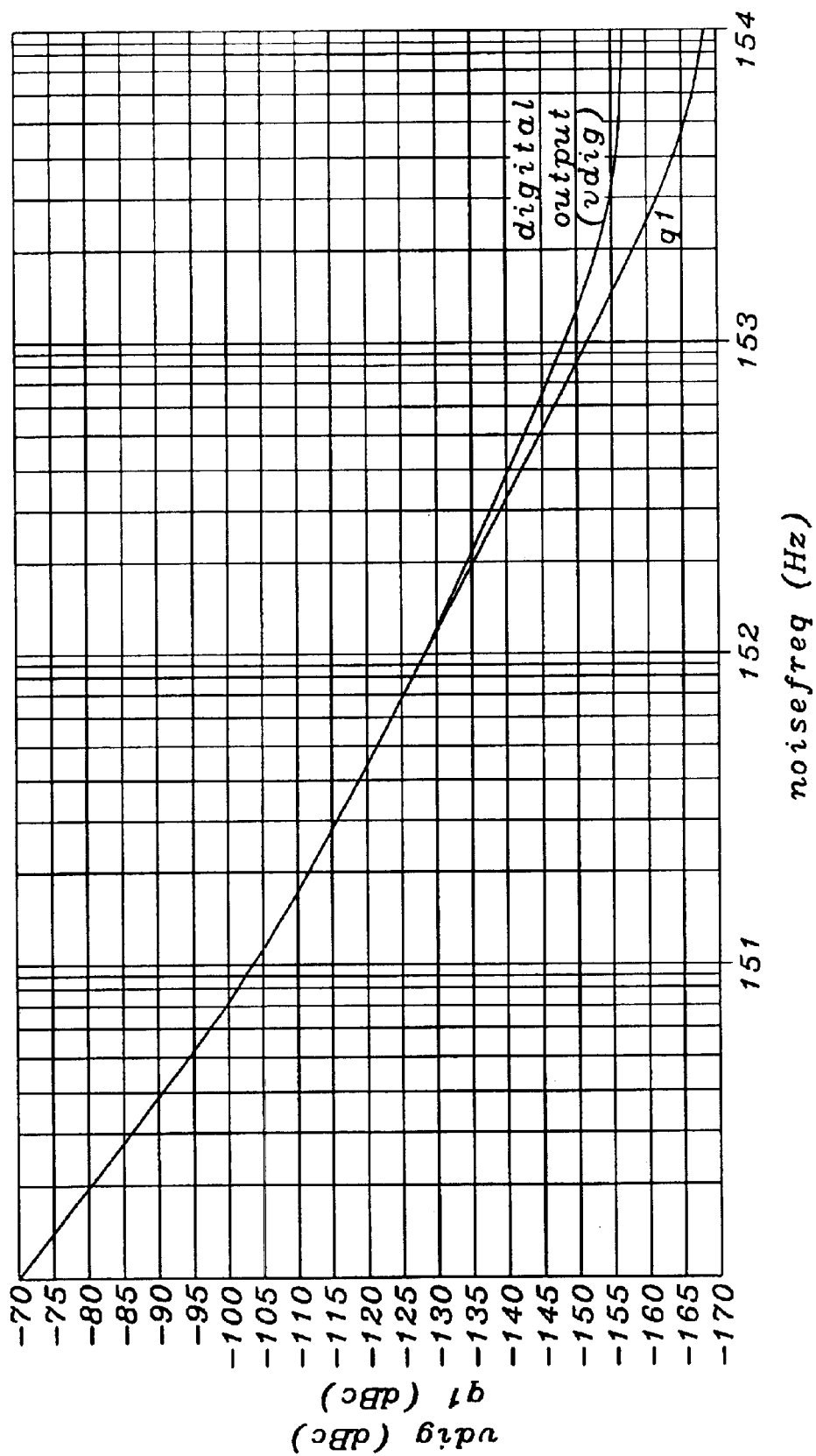
FIG. 10 illustrates the phase noise behavior of the generated oscillator signal in form of a frequency diagram.

Refering to FIG. 10, the results of a computer simulation are shown. The generated plots show the phase noise of the digital output signal "vdig" and of the oscillator signal inside of the resonator, at one side of the XTAL, pin q1. As can be seen, the lower performance with regard to phase noise is obtained at the digital output. Therefore essential effort had to be spent during development to reduce the impact of the digital inverter amplifier back onto the oscillator core.

Figure 11:
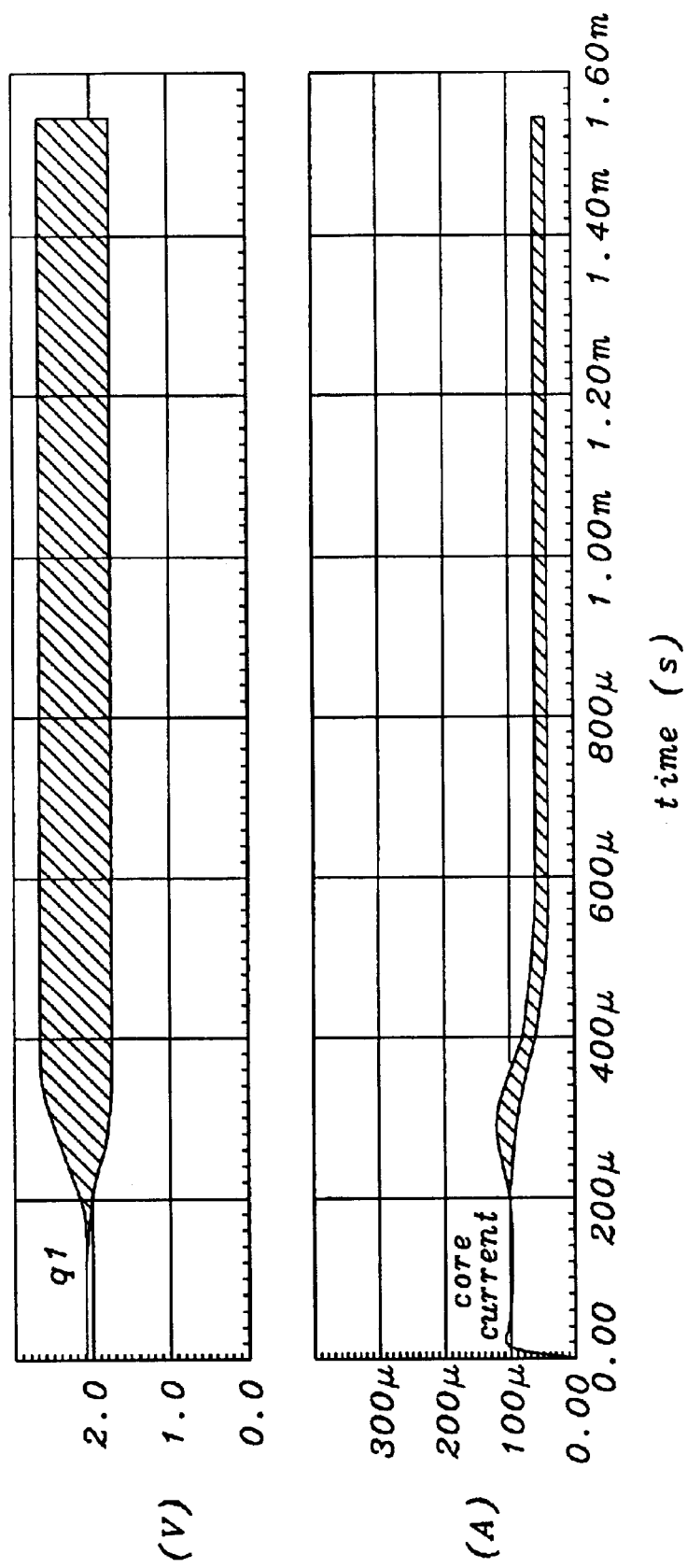
FIG. 11 depicts action and effect of the automatic amplitude control and biasing circuit block, the power up and the start-up circuit blocks in form of a time diagram with two signals, showing the start-up behavior of the oscillator core with regard to the crystal voltage and the behavior of the automatic gain control in view of the current.

In FIG. 11 the time diagram of the internal oscillator signal at pin q1 during start-up action is shown together with the core current, whereby these results are extracted from an appropriate circuit simulation. The time range observed spans a duration of 1.5 ms. For comparison, the essential core current during that action is also plotted in the lower part of the figure. The start-up behavior of the oscillator OSC is thus clearly demonstrated: between approximately 400 μs and 500 μs the oscillator signal reaches already stable operation. Under the influence of the automatic amplitude control at the start-up phase, the core current is significantly enlarged to handle safe start-up, overcoming a short static serial resonance of the crystal XTAL.

For a stable, steady-state operation of the oscillator of the invention, the core current is then reduced to a value with optimized operation (at best transistor transconductance operating points).

Figure 12:
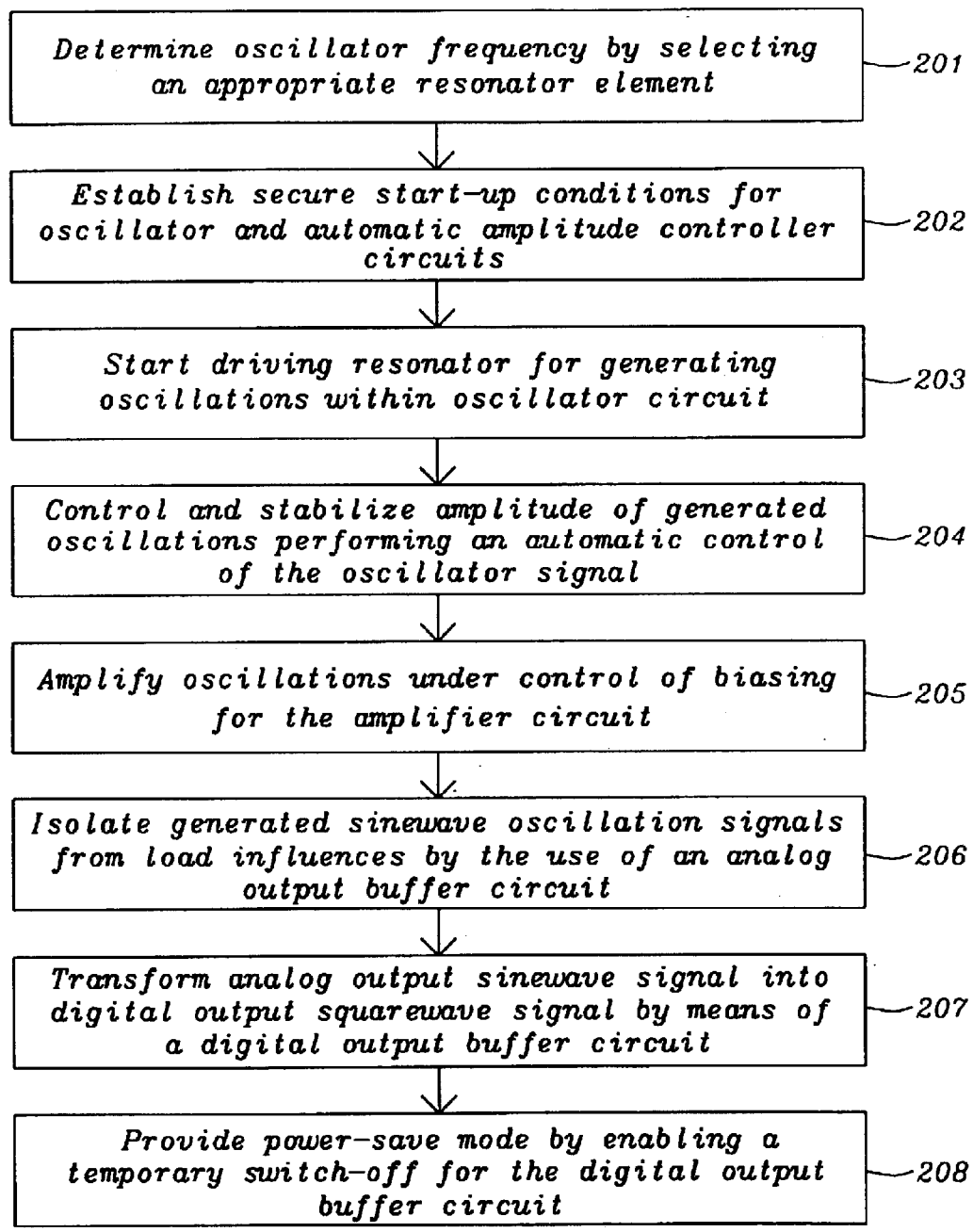
FIG. 12 illustrates the method how to generate the oscillations with the circuit of the invention.

FIG. 12 illustrates the method how to generate the oscillations with the circuit of the invention, as described and explained before.

As a first step 201 is described, how to determine the oscillator frequency by selecting an appropriate resonator element. With step 202 secure start-up conditions for oscillator and automatic amplitude controller circuits are established. Under step 203 driving the resonator for generating oscillations within oscillator circuit starts. Step 204 describes the control and stabilization of the amplitude of the generated oscillations performing an automatic control of the oscillator signal. In step 205 the oscillations are amplified under control of biasing for the amplifier circuit. Step 206 isolates the generated sinewave oscillation signals from load influences by the use of the analog output buffer circuit. With step 207 the analog output sinewave signal is transformed into a digital output squarewave signal by means of the digital output buffer circuit. Step 208 provides a power-save mode by enabling a temporary switch-off for the digital output buffer circuit.

As shown in the preferred embodiments and evaluated by simulations and measurements, the novel circuits provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A circuit, capable of generating a resonator controlled oscillator output signal, comprising:
    means for generating an oscillating signal having a stable and predetermined oscillation frequency;
    means for driving said oscillation generating means and for matching the impedance levels between said oscillation generating means and the oscillator driving means;
    means for automatic amplitude controlling and biasing the generated oscillation signal of said oscillation generating means and said oscillator driving means, controlling the amplification factor (gain) of said oscillator driving means in such a way, that a steady oscillation signal is maintained, biasing the circuits of said oscillation generating means and said oscillator driving means in such a way, that an optimized operating mode is obtained;
    means for a first buffering of said generated oscillation signal of said oscillation generating means and said oscillator driving means as a sinewave signal, named also as analog signal;
    means for a second buffering of said generated oscillation signal of said oscillation generating means and said oscillator driving means as a digitally transformed, rectangular square wave signal;
    means for generating the start-up control signals for said oscillation generating means and said oscillator driving means to ensure a safe start-up procedure; and
    means for generating the power-up and shut-down control signals for said oscillator driving means, for said automatic amplitude controlling and biasing means, for said first buffering means and said second buffering means, and for said start-up means.

2. The circuit according to claim 1 wherein said oscillation generating means comprises a resonator circuit having a crystal resonator element that produces an oscillating signal having a predetermined oscillation frequency.

3. The circuit according to claim 2 wherein said oscillation generating means comprises a resonator circuit element that is oscillating in parallel resonance mode.

4. The circuit according to claim 1 wherein said oscillation generating means comprises a resonator circuit fabricated using MEMS technologies.

5. The circuit according to claim 1 wherein said oscillator driving means comprises a modified Pierce oscillator circuit.

6. The circuit according to claim 5, implementing said Pierce oscillator circuit comprising:
    two transistors—one PMOS and one NMOS—for the oscillator amplifier;
    two PMOS transistors, forming the bias resistors for said amplifier;
    one PMOS transistor, used as start-up aid;
    two capacitors, used as a signal input voltage divider; and
    two capacitors, needed for the 3-point Pierce oscillator scheme.

7. The circuit according to claim 1 wherein said oscillator driving means comprises two signal terminals for concurrent input and output of said oscillating signal from said resonator element, further one control bus terminal and one control signal terminal.

8. The circuit according to claim 1, and as said oscillator driving means comprising:
    a modified Pierce oscillator circuit;
    two signal terminals for concurrent input and output;
    one control bus terminal; and
    one control signal terminal.

9. The circuit according to claim 1 wherein said automatic amplitude controlling and biasing means comprises an automatic amplitude controlling part together with a biasing circuit part.

10. The circuit according to claim 9, implementing said automatic amplitude controlling and biasing circuit, further comprising:
    one resistor and three transistors, —one PMOS and two NMOS (one used as diode, one used as capacitor)— together with another
    four transistors, —two PMOS and two NMOS— composing as current mirrors and resistor, together with said diode and said capacitor, the biasing part for said circuit;
    one PMOS transistor, working as main loop amplifier for said oscillator;
    two capacitors, used as a signal input voltage divider and
    one PMOS transistor, used as resistor together with
    one capacitor, being parts of an RC-filter; and
    two further PMOS transistors, needed for the start-up function.

11. The circuit according to claim 1 wherein said automatic amplitude controlling and biasing means comprises
    one signal terminal for concurrent input and output of said oscillating signal from said resonator element;
    one control bus terminal; and
    two control signal terminals.

12. The circuit according to claim 1, and as said automatic amplitude controlling and biasing means comprising:
    an automatic amplitude controlling part together with a biasing circuit part;
    one signal terminal for concurrent input and output;
    one control bus terminal; and
    two control signal terminals.

13. The circuit according to claim 1 wherein said first buffering means comprises a self biased source follower circuit.

14. The circuit according to claim 13, implementing said self biased source follower circuit further comprising:
    two NMOS transistors, setting up the output stage as said source follower circuit;
    two pairs of transistors, —each consisting of one PMOS and one NMOS type—
    two PMOS transistors, used as resistors and one extra resistor, all together acting as self biasing for said output stage;
    one capacitor, utilized as signal coupling capacitor; and
    five transistors, —two PMOS and three NMOS—used for said start—up procedure.

15. The circuit according to claim 1 wherein said first buffering means comprises
    one signal terminal for input of said oscillating signal from said resonator element;
    one signal output terminal for the analog oscillator signal; and
    one control bus terminal.

16. The circuit according to claim 1, and as said first buffering means comprising:
a self biased source follower circuit;
one signal terminal for input;
one signal terminal for output; and
one control bus terminal.

17. The circuit according to claim 1 wherein said second buffering means comprises a self biased class AB-amplifier stage together with a three stage inverting digital amplifier chain.

18. The circuit according to claim 17, implementing said self biased class AB amplifier stage and three stage inverting digital amplifier chain further comprising:
one pair of transistors, —one PMOS and one NMOS— building said class AB-amplifier stage;
three transistors, —two PMOS and one NMOS—together with
four transistors, —either two PMOS and two NMOS— connected as resistors; for biasing said class AB-amplifier stage;
two capacitors, acting as signal input couplers for said amplifier stage;
three pairs of transistors, —each consisting of one PMOS and one NMOS—each building one stage of said inverting digital amplifier chain; and
four transistors, —one PMOS and three NMOS—used for said start-up procedure.

19. The circuit according to claim 1 wherein said second buffering means comprises
one signal terminal for input of said oscillating signal from said resonator element;
one signal output terminal for the digital oscillator signal; and
one control bus terminal.

20. The circuit according to claim 1, and as said second buffering means comprising:
a self biased class AB-amplifier stage together with a three stage inverting digital amplifier chain;
one signal terminal for input;
one signal terminal for output; and
one control bus terminal.

21. The circuit according to claim 1 wherein said start-up means comprises a multiple transistor gating, inverting and biasing circuit.

22. The circuit according to claim 21, implementing said multiple transistor gating, inverting and biasing circuit further comprising:
one pair of transistors, —one PMOS and one NMOS type—setting up said inverter;
one NMOS transistor for an open input ground clamping function;
two PMOS transistors together with two NMOS transistors forming said biasing circuit; in conjunction with
one pair of transistors, —one PMOS and one NMOS— used as capacitors; and
three transistors, —one PMOS and two NMOS types— for said start—up and gating circuit.

23. The circuit according to claim 1 wherein said start-up means comprises
one control signal input terminal for input of a start-enable control signal;
one control bus terminal; and
two control signal terminals.

24. The circuit according to claim 1, and as said start-up means comprising:
a multiple transistor gating, inverting and biasing circuit;
one control signal input terminal for input;
one control bus terminal; and
two control signal terminals.

25. The circuit according to claim 1 wherein said power-up means comprises a two transistor signal inverting stage with some extra combinational logic circuitry.

26. The circuit according to claim 25, implementing said two transistor signal inverting stage and extra combinational logic;
further comprising:
one pair of transistors, —one PMOS and one NMOS— for said inverting stage;
one PMOS transistor, utilized as resistor therefore;
two logic gates, realized in CMOS for said combinational logic functions.

27. The circuit according to claim 1 wherein said power-up means comprises
two control signal input terminals for input of power-up and shut-down control signals; and
one control bus terminal.

28. The circuit according to claim 1, and as said power-up means comprising:
a two transistor signal inverting stage with some extra combinational logic circuitry;
two control signal input terminals; and
one control bus terminal.

29. The circuit according to claim 1, manufactured in monolithic integrated circuit technology.

30. The circuit according to claim 29, manufactured in monolithic integrated circuit CMOS technology.

31. The circuit according to claim 5, implementing said Pierce oscillator circuit in integrated chip CMOS technology using a triple well manufacturing process.

32. The circuit according to claim 6, implementing said Pierce oscillator circuit manufactured in integrated chip CMOS technology and thereby using integrated metal to metal capacitors.

33. The circuit according to claim 9, implementing said automatic amplitude controlling and biasing circuit in integrated chip CMOS technology using a triple well manufacturing process.

34. The circuit according to claim 10, implementing said automatic amplitude controlling and biasing circuit in integrated chip CMOS technology and thereby using full isolation NMOS transistors.

35. The circuit according to claim 10, implementing said automatic amplitude controlling and biasing circuit in integrated chip CMOS technology and using said one PMOS transistor, used as resistor together with one capacitor, and being parts of an RC-filter whereby the gate of said PMOS transistor is referenced to ground.

36. The circuit according to claim 13, implementing said self biased source follower circuit in integrated chip CMOS technology using a triple well manufacturing process.

37. The circuit according to claim 14, implementing said self biased source follower circuit with considerably enlarged input impedance by use of biasing transistors with ground referenced gates and operating as serially connected resistors.

38. The circuit according to claim 14, implementing said self biased source follower circuit with considerably enlarged input impedance and utilizing a very small signal coupling capacitor.

39. The circuit according to claim 17, implementing said self biased class AB-amplifier stage and three stage inverting digital amplifier chain in integrated chip CMOS technology using a triple well manufacturing process.

40. The circuit according to claim 18, implementing said self biased class AB-amplifier stage and three stage inverting digital amplifier chain, where every inverting stage of the digital amplifier chain has a much greater drive capability than its predecessor.

41. The circuit according to claim 18, implementing said self biased class AB-amplifier stage and three stage inverting digital amplifier chain, where the output driver capability of said class AB-amplifier output stage coupled to the first inverting stage of the digital amplifier chain is very much greater than the driver capability of said first inverting stage.

42. A method for generating a stable, amplitude controlled oscillation signal within an electronic device or technology, comprising:

providing a crystal resonator element for determination of the oscillator frequency;

providing a Pierce oscillator circuit for driving the resonator element;

providing an automatic amplitude control circuit for stabilizing the oscillation signal;

providing a biasing circuit for the amplification of the oscillation signal;

providing an analog output buffer circuit for isolating the oscillator circuit from load influences;

providing a digital output buffer circuit for transforming the sinewave oscillator circuit into a square wave signal;

providing a start-up circuit for establishing secure start-up conditions for the Pierce oscillator and the automatic amplitude controller and biasing circuit;

providing a power-up circuit for fast power-up action and for enabling an operation in power saving mode.

* * * * *